United States Patent [19]

Shieh

[11] Patent Number: 5,406,450
[45] Date of Patent: Apr. 11, 1995

[54] PORTABLE HARD DISK DRIVE CONNECTOR WITH A PARALLEL (PRINTER) PORT CONTROL BOARD

[76] Inventor: Ron-Yen Shieh, P.O. Box 82-144, Taipei, Taiwan, Prov. of China

[21] Appl. No.: 81,236

[22] Filed: Jun. 25, 1993

[51] Int. Cl.[6] .................. H05K 7/10; H01R 33/88
[52] U.S. Cl. .................. 361/686; 361/685; 439/638
[58] Field of Search .............. 439/76, 638, 639, 654, 439/655; 361/683–686; 364/708.1

[56] References Cited

U.S. PATENT DOCUMENTS

| 4,998,183 | 5/1991 | Chiang | 361/686 |
| 5,091,826 | 2/1992 | Arnett et al. | 439/76 X |

*Primary Examiner*—Michael W. Phillips
*Attorney, Agent, or Firm*—Alfred Lei

[57] ABSTRACT

This invention relates to a portable hard disk connector with a parallel (printer) port control board including a casing including an upper cover and a lower cover engaged with the upper cover, the control board fixedly fitted in the lower cover and having a parallel (printer) port interface input connector, a parallel (printer) port output connector, and two hard disk drive connectors, the connectors partly protruding out of the casing, a switch mounted on the control board and partly protruding out of the casing, and a female connector for connecting a hard disk drive, connected with the rear side of the hard disk drive connector, whereby a 1.8″ hard disk drive can be fitted in the casing and connected with the female connector and furthermore, the hard disk drive connectors can be externally connected with one to two hard disk drives as desired.

1 Claim, 3 Drawing Sheets

PORTABLE HARD DISK DRIVE CONNECTOR WITH A PARALLEL (PRINTER) PORT CONTROL BOARD

BACKGROUND OF THE INVENTION

Although note book computers allow further reduction in size and weight, most users still prefer to carry the hard disk drive and interface board if the place to which they are going is provided with computer(s). This is just because the note book computer is larger and heavier than the hard disk drive. Nevertheless, the commonly used hard disk drive is still too large in size and furthermore, it is necessary to dismantle the computer for installing the hard disk drive thereby causing much inconvenience in use.

Therefore, it is an object of the present invention to provide a portable hard disk drive connector with a parallel (printer) port control board which may obviate and mitigate the above-mentioned drawbacks.

SUMMARY OF THE INVENTION

This invention relates to a portable hard disk drive connector with a parallel (printer) port control board.

It is the primary object of the present invention to provide a portable hard disk drive connector with a parallel (printer) port control board in which a 1.8" hard disk drive may be fitted.

It is another object of the present invention to provide a portable hard disk drive connector with a parallel (printer) port control board which may be externally connected with at least one hard disk drive.

It is still another object of the present invention to provide a portable hard disk drive connector with a parallel (printer) port control board which may be connected with other storage devices with the same interface.

It is still another object of the present invention to provide a portable hard disk drive connector with a parallel (printer) port control board which is lightweight and compact in size.

It is a further object of the present invention to provide a portable hard disk drive connector with a parallel (printer) port control board which can be connected to a computer printer port directly without extra cable.

Other objects and merits and a fuller understanding of the present invention will be obtained by those having ordinary skill in the art when the following detailed description of the preferred embodiment is read in conjunction with the accompanying drawings wherein like numerals refer to like or similar parts.

DETAILED DESCRIPTION OF THE PREFERRED EMBODIMENT

Figure 1:
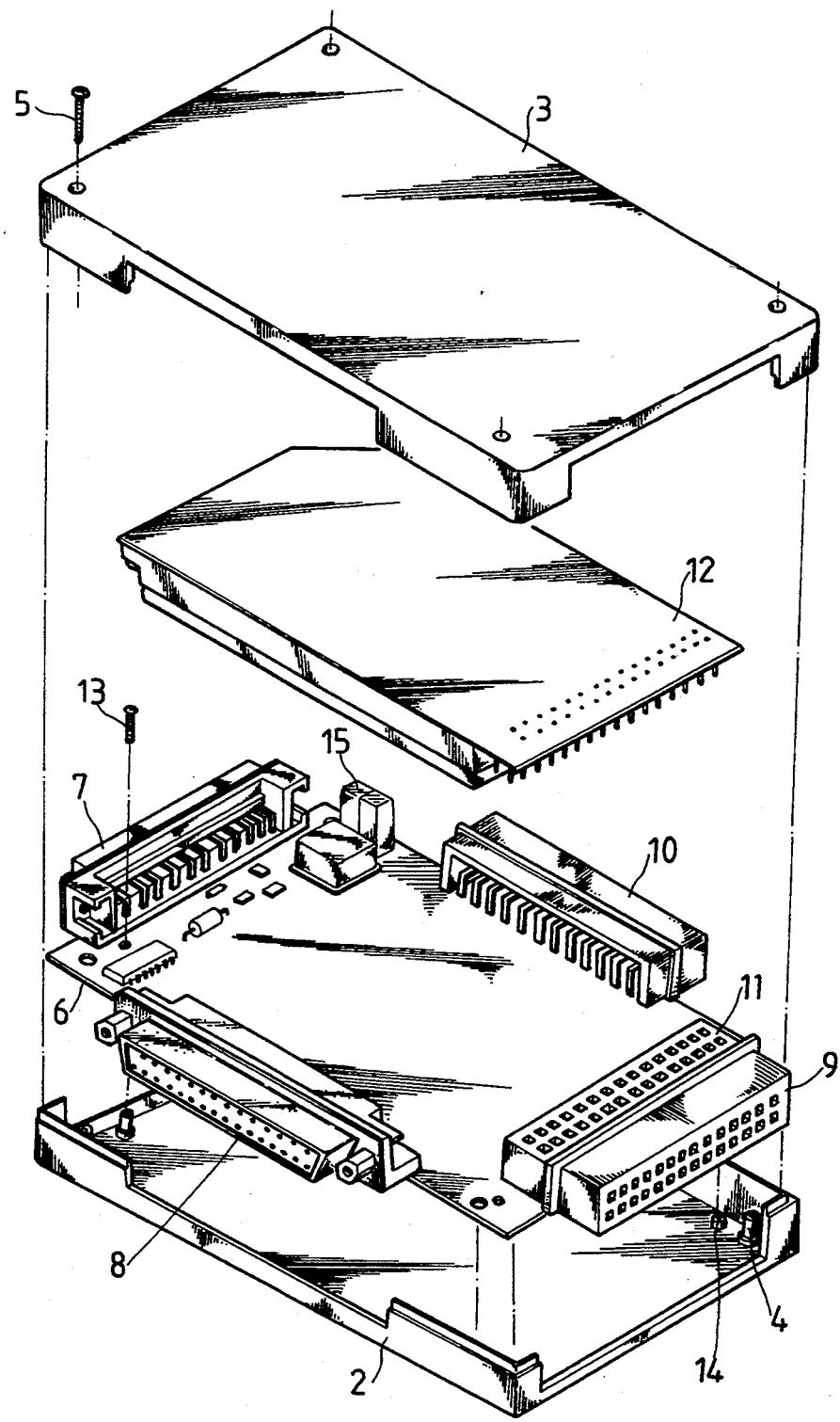
FIG. 1 is an exploded view of the present invention.

For the purpose of promoting an understanding of the principles of the invention, reference will now be made to embodiment illustrated in the drawings. Specific language will be used to describe same. It will, nevertheless, be understood that no limitation of the scope of the invention is thereby intended, such alternations and further modifications in the illustrated device, and such further applications of the principles of the invention as illustrated herein being contemplated as would normally occur to one skilled in the art to which the invention relates.

Figure 2:
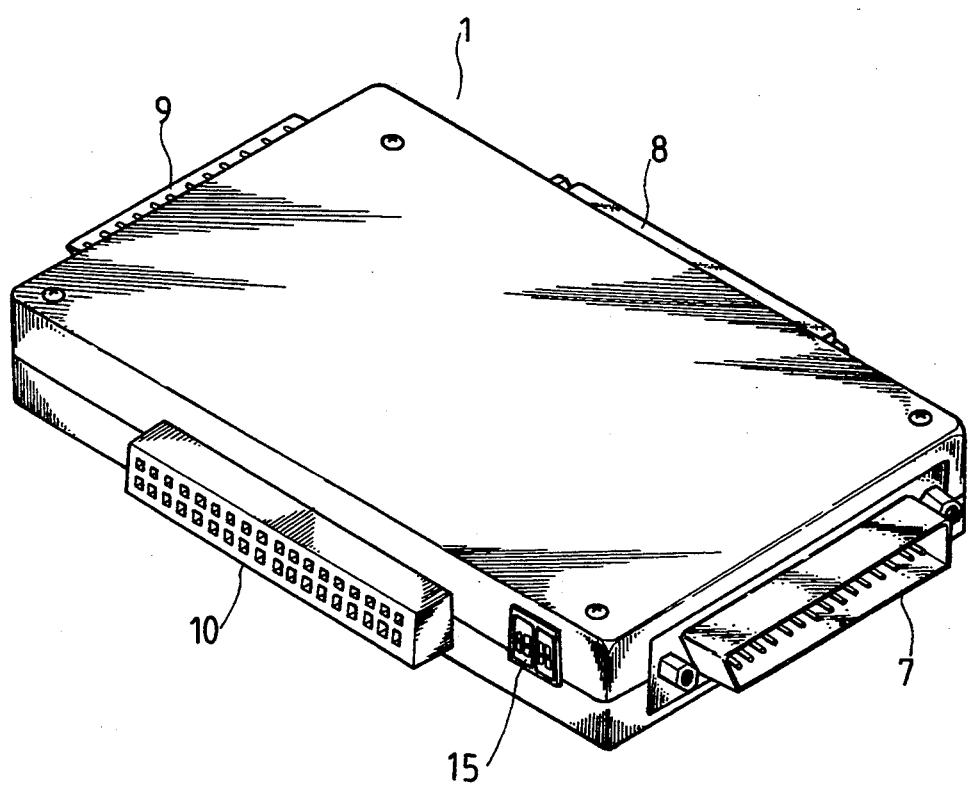
FIG. 2 is a perspective view of the present invention.
Figure 3:
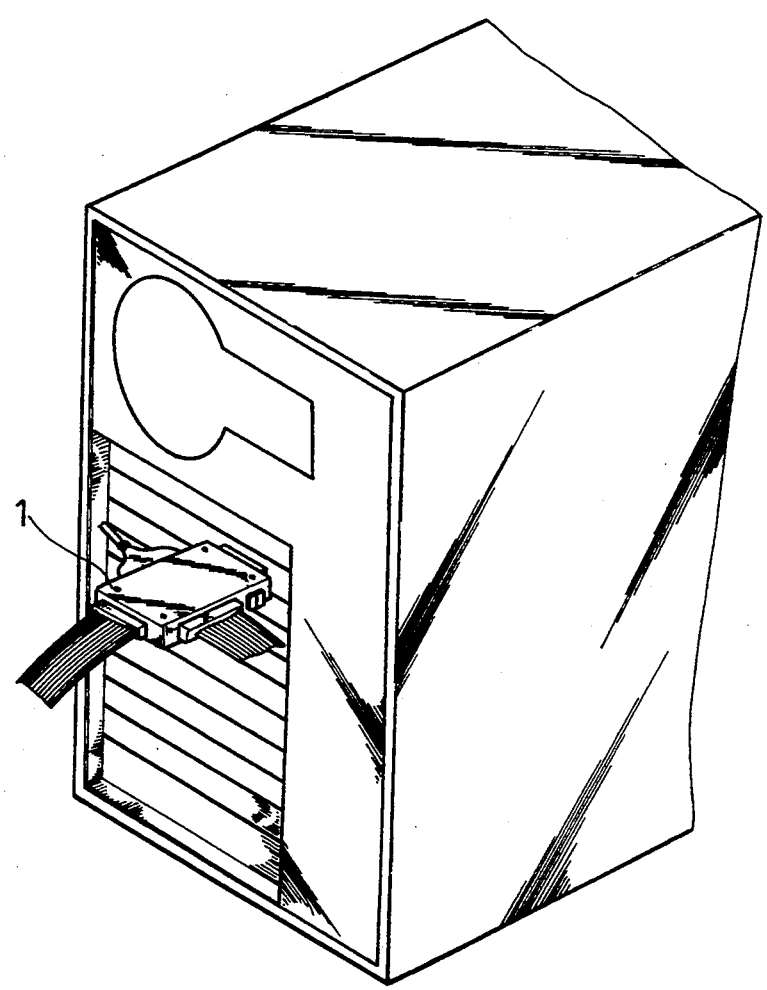
FIG. 3 is a working view of the present invention.

With reference to the drawings and in particular to FIGS. 1 and 2 thereof, the portable hard disk connector with a parallel (printer) port control board according to the present invention comprises a casing 1 composed of an upper cover 3 and a lower cover 2. On the lower cover 2 there are a plurality of threaded sleeves 4 so that the upper cover 3 may be engaged with the lower cover 2 by engaging screws 5 with the threaded sleeves 4. A control card 6 is fitted in the lower cover 2 and provided with a parallel (printer) port interface input connector 7, a parallel (printer) port output connector 8, and two hard disk connectors 9 and 10. The rear side of the hard disk connector 9 is connected with a female connector 11 for connecting a 1.8" hard disk drive 12. Hence, the connector 7 can be directly connected with a printer connector of a computer (see FIG. 3). Accordingly, it will be convenient to read the data in the 1.8" hard disk drive 12 or in a hard disk drive externally connected to the present invention. The technique for an interface control board is well known to those skilled in the art and is not considered a part of the invention. Further, the control board 6 is fixedly mounted on the lower cover 2 by engaging screws 13 with the threaded sleeves 14 thereof.

As illustrated in FIG. 2, the portable hard disk drive connector with a parallel (printer) port control board according to the present invention is provided with a parallel (printer) port interface input connector 7, a parallel (printer) port output connector 8, and two hard disk drive connectors 9 and 10. Hence, the present invention can be conveniently connected to a printer connector of a computer. In addition, when the present invention is connected with an external hard disk drive, simply adjust the switch 15 to set the relationship between the principal and the secondary.

Although the present invention has been described with a certain degree of particularity, it is understood that the present disclosure is made by way of example only and that numerous changes in the detail of construction and the combination and arrangement of parts may be resorted to without departing from the spirit and scope of the invention as hereinafter claimed.

I claim:

1. A portable hard disk drive connector with a parallel (printer) port control board comprising:
    a casing including an upper cover and a lower cover engaged with the upper cover;
    said control board fixedly fitted in said lower cover and having a parallel (printer) port interface input connector, a parallel (printer) port output connector, and first and second hard disk drive connectors, all of said connectors partly protruding out of said casing;
    a switch mounted on said control card and partly protruding out of said casing; and
    a female connector for connecting a hard disk drive within said casing, said female connector connected with a rear side of said first hard disk drive connector;
    whereby a 1.8" hard disk drive can be fitted in said casing and connected with said female connector and furthermore, said second hard disk drive connector can be externally connected with an additional hard disk drive as desired, and said first and second hard disk drive connectors can be externally connected with up to two hard disk drives if the 1.8" hard disk drive is not connected inside said casing.

* * * * *